(12) United States Patent
Hanson

(10) Patent No.: US 7,528,536 B2
(45) Date of Patent: May 5, 2009

(54) PROTECTIVE LAYER FOR CORROSION PREVENTION DURING LITHOGRAPHY AND ETCH

(75) Inventor: Robert J. Hanson, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 1104 days.

(21) Appl. No.: 10/826,660

(22) Filed: Apr. 16, 2004

(65) Prior Publication Data

US 2009/0085459 A1    Apr. 2, 2009

Related U.S. Application Data

(60) Continuation of application No. 10/365,925, filed on Feb. 13, 2003, now Pat. No. 6,759,181, which is a continuation of application No. 10/084,685, filed on Feb. 26, 2002, now Pat. No. 6,548,227, which is a division of application No. 09/382,881, filed on Aug. 25, 1999, now Pat. No. 6,387,600.

(51) Int. Cl.
*H01J 1/62* (2006.01)
*H01J 63/04* (2006.01)

(52) U.S. Cl. .................. 313/492; 313/491
(58) Field of Classification Search ............ 313/306, 313/309–310, 346, 351, 355, 491–497
See application file for complete search history.

(56) References Cited

U.S. PATENT DOCUMENTS 5,478,766 A    12/1995    Park et al.
5,643,033 A    7/1997    Gnade et al.

(Continued)

FOREIGN PATENT DOCUMENTS

JP    1024025    1/1989

(Continued)

OTHER PUBLICATIONS

J.E.A.M. van den Meerakker and W. R. ter Veen, "Reductive Corrosion of ITO in Contact with Al in Alkaline Solutions," J. Electrochem Soc., vol. 139, No. 2, Feb. 1992, pp. 395-390.

(Continued)

*Primary Examiner*—Sikha Roy
*Assistant Examiner*—Jose M Diaz
(74) *Attorney, Agent, or Firm*—Knobbe, Martens, Olson & Bear, LLP

(57) ABSTRACT

Forming a protective layer such as chromium, chrome alloys, nickel or cobalt as a cap over an aluminum film protects an underlying ITO layer from corrosion during the fabrication of flat panel displays such as field emission devices and the like. The presence of the protective layer during fabrication processes such as photolithography prevents diffusion of solutions through the aluminum into the ITO. This protective layer is especially effective during the development and resist stripping stages of photolithography which use solutions or solvents that would otherwise cause reductive corrosion of ITO in contact with aluminum. The methods and apparatus described herein are particularly advantageous for the fabrication of flat panel displays such as field emission devices and other display devices, because ITO is often used in such devices in contact with aluminum while exposed to corrosion-inducing media.

20 Claims, 9 Drawing Sheets

U.S. PATENT DOCUMENTS

| | | | |
|---|---|---|---|
| 5,654,220 A * | 8/1997 | Leedy | 438/25 |
| 6,172,733 B1 * | 1/2001 | Hong et al. | 349/152 |
| 6,329,750 B1 * | 12/2001 | Hofmann et al. | 313/495 |
| 6,387,600 B1 | 5/2002 | Hanson | |
| 6,548,227 B2 | 4/2003 | Hanson | |
| 6,650,043 B1 * | 11/2003 | Derraa | 313/497 |
| 6,759,181 B2 | 7/2004 | Hanson | |

FOREIGN PATENT DOCUMENTS

| | | |
|---|---|---|
| JP | 6236893 | 8/1994 |
| JP | 6347811 A | 12/1994 |
| JP | 9090415 | 4/1997 |

OTHER PUBLICATIONS

Hiromi Nishino et al., "Anti-Corrosion Process for Al-ITO System with Electrolytic Development Solution," Sharp Technical Journal, No. 44, pp. 31-36.

* cited by examiner

PROTECTIVE LAYER FOR CORROSION PREVENTION DURING LITHOGRAPHY AND ETCH This is a continuation of U.S. application Ser. No. 10/365,925, filed on Feb. 13, 2003, now U.S. Pat. No. 6,759,181 which is a continuation of U.S. application Ser. No. 10/084,685, filed Feb. 26, 2002, now U.S. Pat. No. 6,548,227, which is a divisional of U.S. application Ser. No. 09/382,881 filed on Aug. 25, 1999, now U.S. Pat. No. 6,387,600. The entire contents of the above US patents and applications are incorporated herein by reference.

REFERENCE TO GOVERNMENT CONTRACT

This invention was made with United States Government support under Contract No. DABT63-97-C-0001, awarded by the Advanced Research Projects Agency (ARPA). The United States Government has certain rights in this invention.

BACKGROUND OF THE INVENTION

1. Field of the Invention

This invention relates to preventing reductive corrosion of indium tin oxide (ITO) in the presence of aluminum in alkaline or basic solutions or solvents, and more particularly, to a method and apparatus for maintaining the quality of electrical and optical properties of an ITO layer during fabrication of a flat panel display.

2. Description of the Related Art

Optically transparent and electrically conductive materials such as indium tin oxide (ITO) find utility in flat panel display (FPD) industries such as field emission displays (FEDs), liquid crystal displays (LCDs), and organic light emitting devices (OLEDs), as well as in solar cells. Surface and bulk characteristics are imperative to the quality of electrical and optical properties of these and other optically transparent and electrically conductive films. It is therefore very important to ensure that such films exhibit the desired surface and bulk properties such that the desired degree of transmission of visible light and electrical properties are obtained.

Devices incorporating ITO often use an aluminum layer deposited over the ITO. For instance, in an FED device where the faceplate is connected to the baseplate using spacers, aluminum is often deposited over the ITO layer in the faceplate to establish sites for the bonding of misaligned spacers. More particularly, an aluminum layer is formed over the ITO layer, the aluminum layer having wells extending therein to the surface of the ITO layer. Bond pads are provided within these wells against the ITO layer at the desired spacer locations. Then, when an array of spacers is brought against the faceplate for anodic bonding, desired spacers contained in the array will bond to the bond pads, while other, misaligned spacers will bond to the aluminum layer. After bonding is complete, the aluminum layer with the misaligned spacers bonded thereto can be removed to leave the desired spacer configuration in the FED.

A problem with using aluminum with ITO in the above and other applications is that ITO is susceptible to corrosion in the presence of aluminum. Atomic and/or ionic diffusion occurs through the aluminum to the ITO during processes such as anodic bonding, thermal cycling, thermal diffusion processes, low energy ion implantation processes, and processes which include electric and/or magnetic fields. ITO is especially susceptible to corrosion in the presence of aluminum when exposed to alkaline or basic solutions or solvents. See, J. E. A. M. van den Meerakker and W. R. ter Veen, *J. Electrochem. Soc.*, vol. 139, no. 2, 385 (1992). Corrosion of ITO in alkaline solutions produces $SnO_3^{2-}$, which dissolves in the solution, and In metal, which forms grains at the surface. This causes a gray opaque appearance and a disconnection between the ITO and aluminum. Corrosion of the ITO can prove fatal in devices such as flat panel displays by reducing or eliminating the electrical conductivity and optical transparency of the ITO material. This corrosion can also cause delamination of the aluminum layer from the ITO. Redeposition of corrosion byproducts onto the substrate leads to additional defects, e.g., particle defects.

This problem becomes especially pronounced when the fabrication of the display or other devices includes a photolithography step. For instance, during the development stage of photolithography, diffusion of the developer, such as TMAH or other basic developers, through the aluminum causes reductive corrosion of ITO. Furthermore, stripping of the photoresist involves the use of a solvent-based wet process that may also cause corrosion. This is especially true when the pH of the solvent stripper is greater than seven and the ratio of aluminum to ITO surface area exposed to the solvent is high.

Accordingly, what is needed is a method and apparatus to prevent the corrosion of ITO when in contact with aluminum during photolithography or when otherwise exposed to corrosion-inducing solutions.

SUMMARY OF THE INVENTION

Briefly stated, the needs addressed above are satisfied by forming a protective layer such as chromium, chrome alloys, nickel or cobalt as a cap over the aluminum film to protect the underlying ITO layer from corrosion. The presence of the protective layer during fabrication processes such as photolithography prevents diffusion of solutions through the aluminum into the ITO. This protective layer is especially effective during the development and resist stripping stages of photolithography which use solutions or solvents that would otherwise cause reductive corrosion of ITO in contact with aluminum. The methods and apparatus described herein are particularly advantageous for the fabrication of flat panel displays such as field emission devices and other display devices, because ITO is often used in such devices in contact with aluminum while exposed to corrosion-inducing media.

In accordance with one aspect of the present invention, a method is provided for preventing corrosion of a structure having a tin oxide layer in contact with an aluminum layer while exposed to a solution. A protective layer is formed on the aluminum layer, thereby exposing the protective layer to the solution while reducing the surface area of the aluminum layer exposed to the solution. This protective layer inhibits diffusion of the solution through the aluminum layer into the tin oxide layer. In one embodiment, the tin oxide layer is made of indium tin oxide and the protective layer is made of a material selected from the group consisting of chromium, chrome alloys, nickel and cobalt. After the protective layer is no longer exposed to the solution, the protective layer is removed.

In accordance with another aspect of the present invention, a display device structure comprises a substrate, an electrically conductive and optically transparent layer over the substrate, an aluminum layer over the electrically conductive and optically transparent layer, and a protective layer over the aluminum layer. In one embodiment, the electrically conductive and optically transparent layer is made of indium tin oxide. In another embodiment, a barrier layer is provided between the layer of electrically conductive and optically transparent material and the aluminum layer.

In accordance with another aspect of the present invention, a method of manufacturing a display device structure is provided. An indium tin oxide layer is formed over a substrate. An aluminum layer is formed over the indium tin oxide layer. A protective layer is formed over the aluminum layer. In one embodiment, the display device structure is exposed to an indium tin oxide-corrosive medium, and the protective layer acts as a barrier to the corrosive medium.

In accordance with another aspect of the present invention, a method of patterning an aluminum layer over a tin oxide layer is provided. The method comprises forming an aluminum layer over the tin oxide layer, forming a protective layer over the aluminum layer, and forming a photoresist layer over the protective layer. Regions of the photoresist layer are selectively exposed to ultraviolet light, and these regions of the photoresist layer are developed to expose selected regions of the protective layer. The exposed selected regions of the protective layer are removed to expose selected regions of the aluminum layer. The exposed selected regions of the aluminum layer are removed, and the photoresist layer is stripped from the protective layer. The protective layer is removed to leave the desired device structure.

DETAILED DESCRIPTION OF THE PREFERRED EMBODIMENTS

The preferred embodiments describe flat panel display devices, and more particularly, fabrication of the faceplate of an FED device using indium tin oxide and the like. It will be appreciated that although the preferred embodiments are described with respect to FED devices, the methods and apparatus taught herein are applicable to other flat panel display devices such as liquid crystal displays (LCDs), organic light emitting devices (OLEDs), plasma displays, vacuum fluorescent displays (VFDs), electroluminescent displays (ELDs), as well as solar cells. Other devices incorporating ITO and similar materials, such as other tin oxides, are also contemplated as being within the scope of this invention, as well as any device which employs an aluminum layer formed over an ITO or similar layer.

Figure 1:
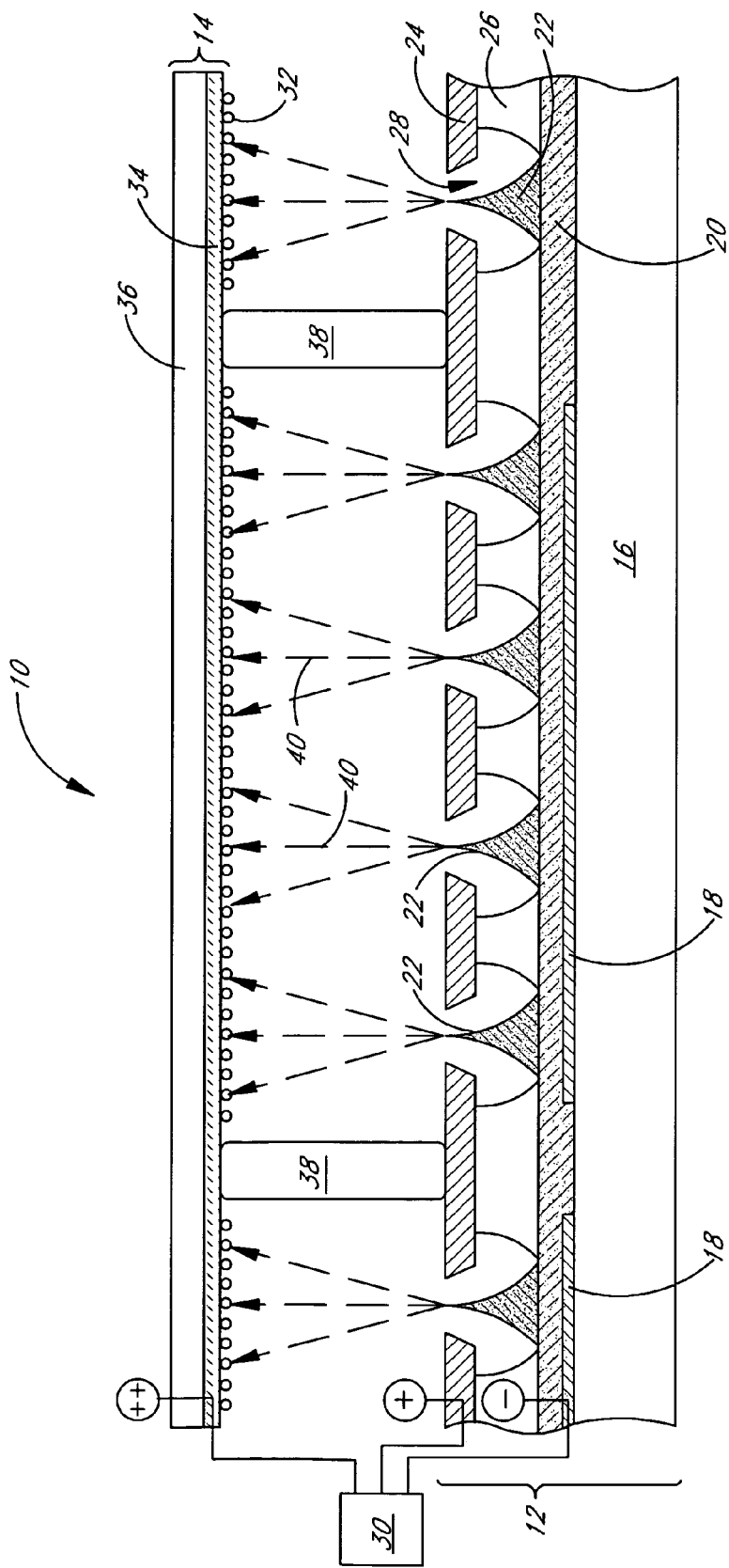
FIG. 1 is a schematic cross-sectional view of a flat panel display including a plurality of field emission devices.

FIG. 1 illustrates a portion of a flat panel display, including a plurality of field emission devices. Flat panel display 10 comprises a baseplate 12 and a faceplate 14. Baseplate 12 includes substrate 16, which is preferably formed from an insulative glass material. Column interconnects 18 are formed and patterned over substrate 16. The purpose and function of column interconnects 18 is disclosed in greater detail below. Furthermore, a resistor layer 20 may be disposed over column interconnects 18. Electron emission tips 22 are formed over substrate 16 at the sites from which electrons are to be emitted, and may be constructed in an etching process from a layer of amorphous silicon that has been deposited over substrate 16. Electron emission tips 22 are protrusions that may have one or many shapes, such as pyramids, cones, or other geometries that terminate at a fine point for the emission of electrons.

An extraction grid 24, or gate, which is a conductive structure that supports a positive charge relative to the electron emission tips 22 during use, is separated from substrate 16 with a dielectric layer 26. Extraction grid 24 includes openings 28 through which electron emission tips 22 are exposed. Dielectric layer 26 electrically insulates extraction grid 24 from electron emission tips 22 and the associated column interconnects which electrically connect the emission tips with a voltage source 30.

Faceplate 14 includes a plurality of pixels 32, which comprise cathodoluminescent material that generates visible light upon being excited by electrons emitted from electron emission tips 22. For example, pixels 32 may be red/green/blue full-color triad pixels. Faceplate 14 further includes a substantially transparent anode 34 and a glass or another transparent panel 36. Spatial support structures or spacers 38 are disposed between baseplate 12 and faceplate 14 and prevent the faceplate from collapsing onto the baseplate due to air pressure differentials between the opposite sides of the faceplate. In particular, the gap between faceplate 14 and baseplate 12 is typically evacuated, while the opposite side of the faceplate generally experiences ambient atmospheric pressure.

The flat panel display is operated by generating a voltage differential between electron emission tips 22 and grid structure 24 using voltage source 30. In particular, a negative charge is applied to electron emission tips 22, while a positive charge is applied to grid structure 24. The voltage differential activates electron emission tips 22, whereby a flux of electrons 40 is emitted therefrom. In addition, a relatively large positive charge is applied to anode 34 using voltage source 30, with the result that a flux of electrons 40 strikes the faceplate. The cathodoluminescent material of pixels 32 is excited by the impinging electrons, thereby generating visible light. The coordinated activation of multiple electron emission tips over the flat panel display 10 may be used to produce a visual image on faceplate 14.

Figure 2:
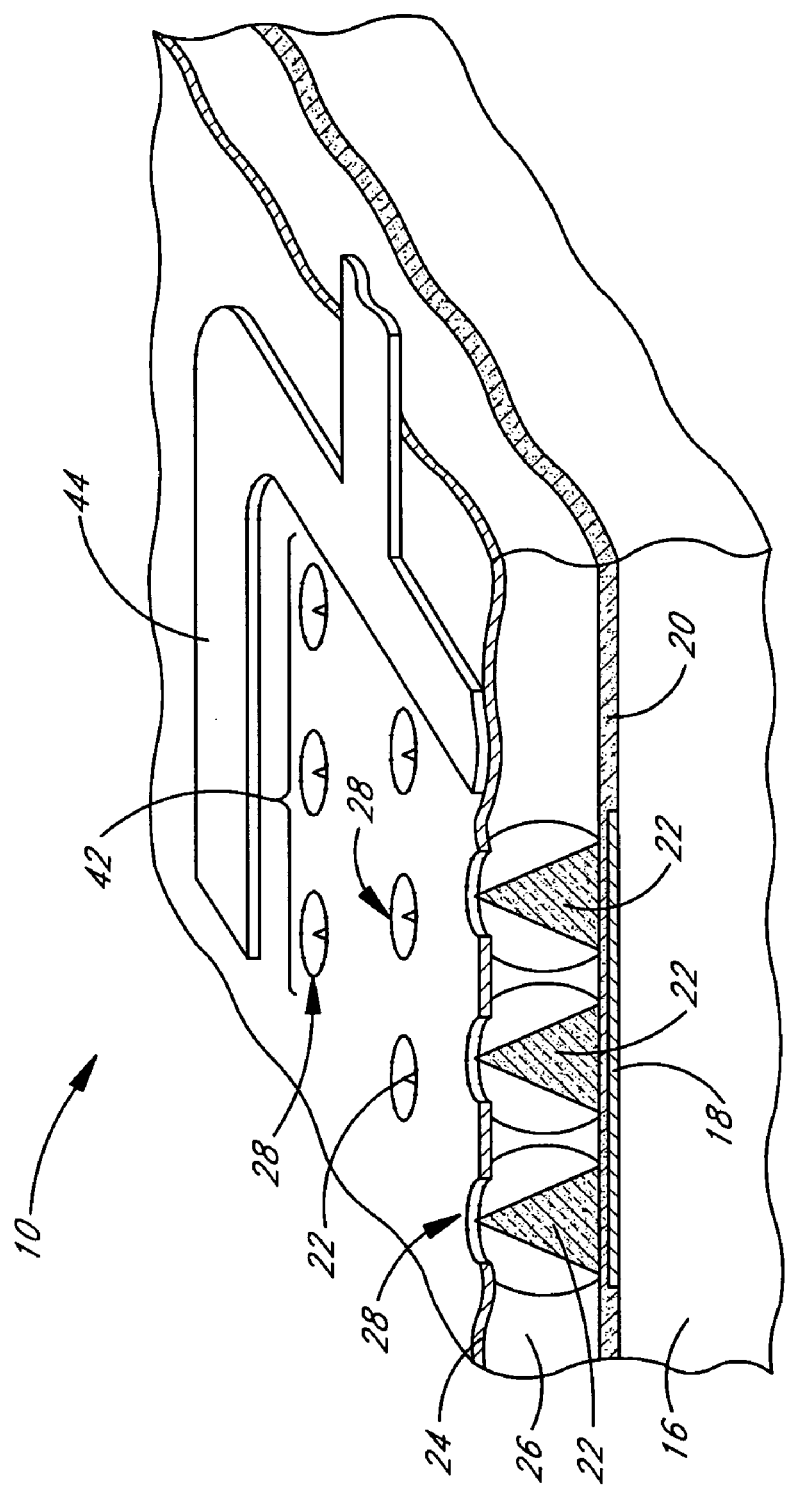
FIG. 2 is an isometric view of a baseplate of a flat panel display, showing an emitter set comprising a plurality of electron emission tips.
Figure 3:
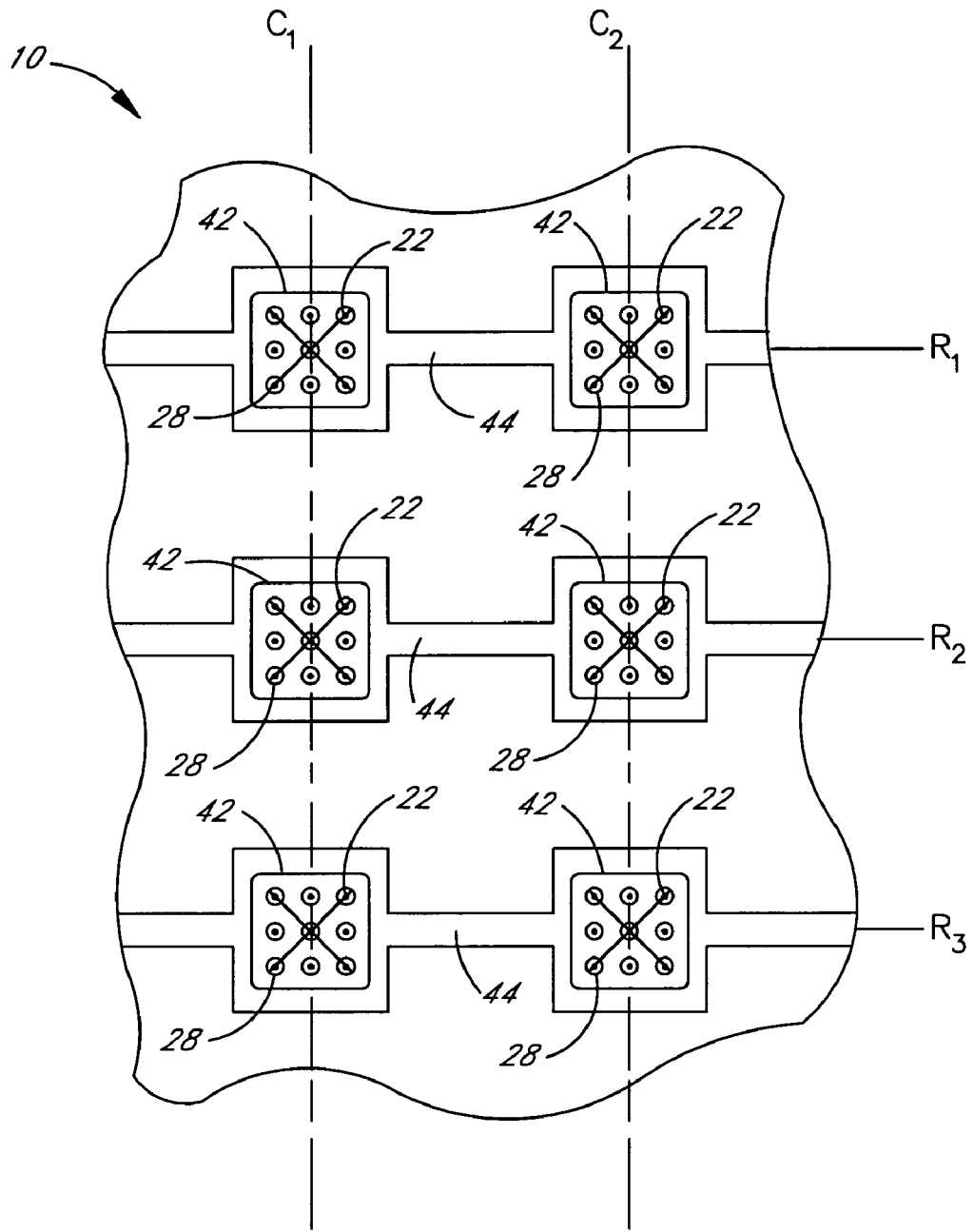
FIG. 3 is a top view of the baseplate of the flat panel display of FIG. 2, showing the addressable rows and columns.

FIGS. 2 and 3 further illustrate conventional field emission devices. In particular, electron emission tips 22 are grouped into discrete emitter sets 42, in which the bases of the electron emission tips in each set are commonly connected. As shown in FIG. 3, for example, emitter sets 42 are configured into columns (e.g., $C_1$-$C_2$) in which the individual emitter sets 42 in each column are commonly connected. Additionally, the extraction grid 24 is divided into grid structures, with each emitter set 42 being associated with an adjacent grid structure. In particular, a grid structure is a portion of extraction grid 24 that lies over a corresponding emitter set 42 and has openings 28 formed therethrough. The grid structures are arranged in rows (e.g., $R_1$-$R_3$) in which the individual grid structures are commonly connected in each row. Such an arrangement allows an X-Y addressable array of grid-controlled emitter sets. The two terminals, comprising the electron emission tips 22 and the grid structures, of the three terminal cold cathode emitter structure (where the third terminal is anode 34 in faceplate 14 of FIG. 1) are commonly connected along such columns and rows, respectively, by means of high-speed interconnects. In particular, column interconnects 18 are formed over substrate 16, and row interconnects 44 are formed over the grid structures.

In operation, a specific emitter set is selectively activated by producing a voltage differential between the specific emission set and the associated grid structure. The voltage differential may be selectively established through corresponding drive circuitry that generates row and column signals that intersect at the location of the specific emitter set. Referring to FIG. 3, for example, a row signal along row $R_2$ of the extraction grid 24 and a column signal along column $C_1$ of emitter sets 42 activates the emitter set at the intersection of row $R_2$ and column $C_1$. The voltage differential between the grid structure and the associated emitter set produces a localized electric field that causes emission of electrons from the selected emitter set.

Further details regarding FED devices are disclosed in assignee's copending application entitled FIELD EMISSION DEVICE WITH BUFFER LAYER AND METHOD OF MAKING, Ser. No. 09/096,085, filed Jun. 11, 1998, and U.S. Pat. No. 5,372,973, both of which are hereby incorporated by reference in their entirety.

Figure 4:
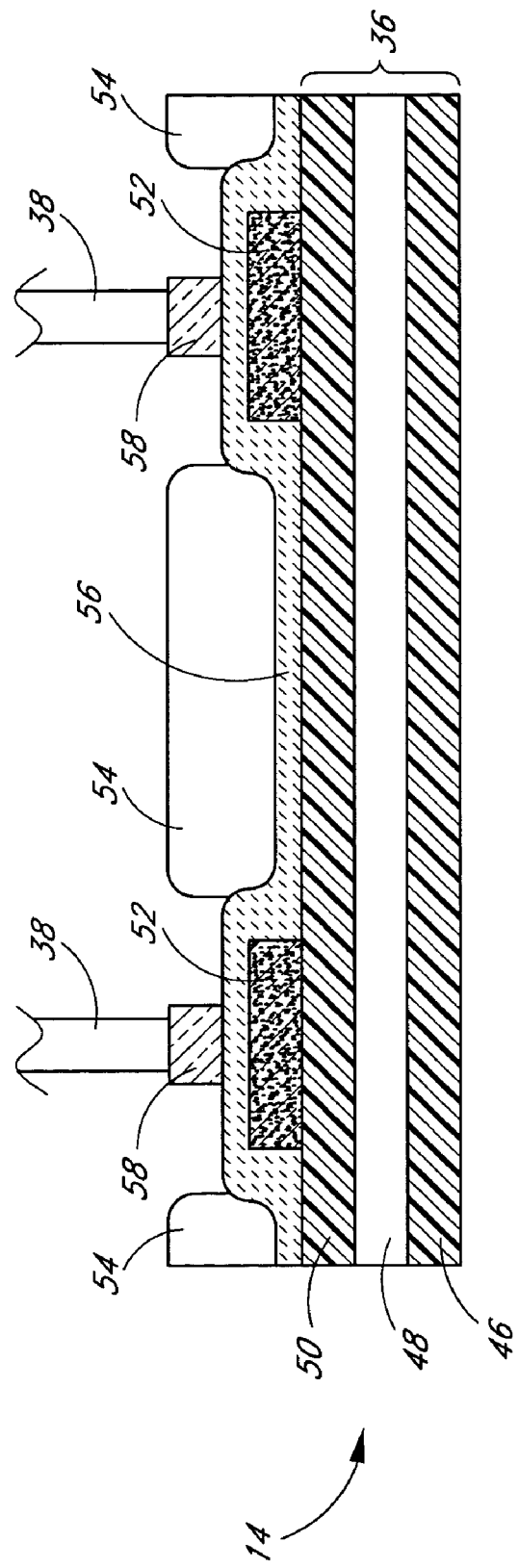
FIG. 4 is a schematic cross-sectional view of an FED faceplate bonded to a plurality of spacers.

FIG. 4 illustrates more particularly a portion of a faceplate of an FED device fabricated according to a preferred embodiment of the present invention. The faceplate 14, shown upside-down relative to the faceplate of FIG. 1, includes a substrate 36 comprising a glass substrate 48, a first $SiN_x$ layer 46 formed on one side of the glass substrate 48, and a second $SiN_x$ layer 50 formed on the other side of the glass substrate 48. The first $SiN_x$ layer 46 represents the viewing side of the faceplate 14, and is preferably about 500 to 2000 Å thick. The glass layer 48 is preferably soda lime glass or borosilicate glass, and preferably has a thickness between about 0.5 and 5 mm. The second $SiN_x$ layer 50 is an antireflective layer preferably about 500 to 2000 Å thick. In one embodiment, both the first and second $SiN_x$ layers are more preferably $Si_3N_4$.

A black matrix grill 52 is preferably formed over the $SiN_x$ layer 50. This grill 52 is preferably made of sputtered amorphous Si, and defines open regions for phosphor layer 54. The grill 52 preferably has a thickness of between 3000 and 20,000 Å, with the openings in the grill preferably created by using an etchant such as an $HNO_3$, HF, acetic acid mixture to etch the amorphous silicon, or KOH/IPA mixtures.

The transparent anode 34 of FIG. 1 is preferably a layer of indium tin oxide 56 as shown in FIG. 4. The ITO layer 56 is preferably formed over the black matrix Si layer 52 and over the $SiN_x$ layer 50. The ITO layer 56 is preferably deposited using physical vapor deposition, for example DC sputtering, and has a thickness preferably between about 2000 and 5000 Å. The applied voltage across the ITO layer is preferably about 1000 to 3000 DC volts.

Figure 5:
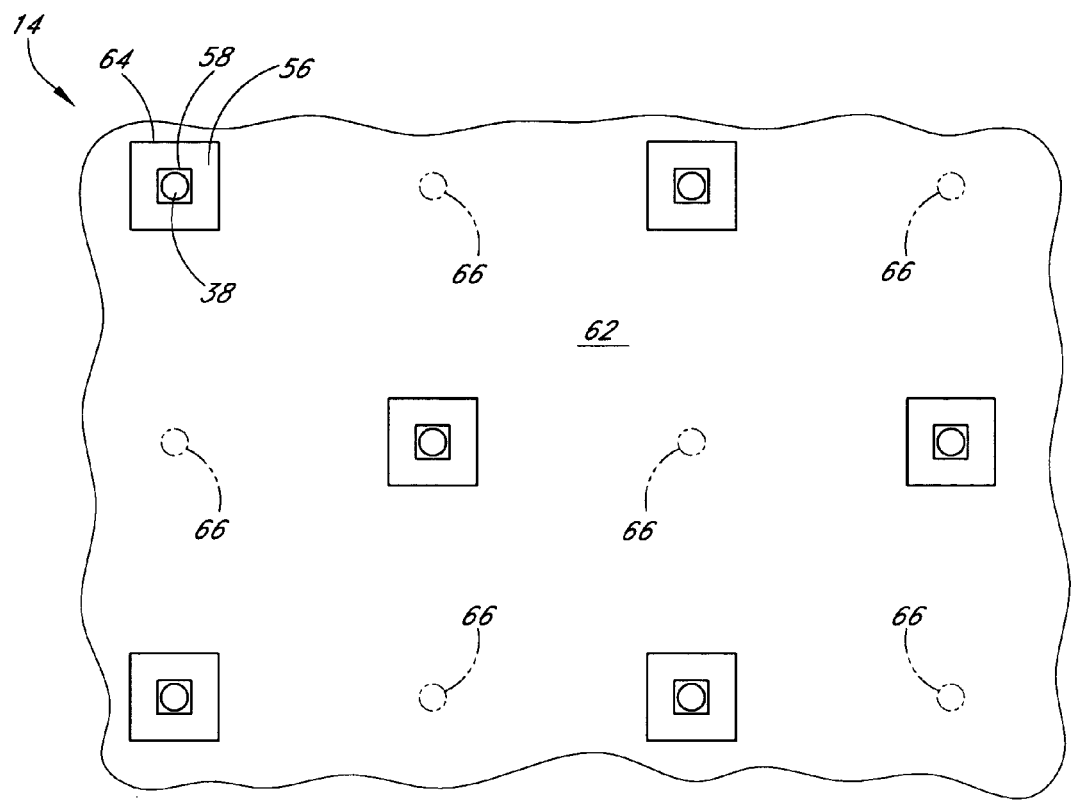
FIG. 5 is a schematic top view of the faceplate of FIG. 4, showing an aluminum layer deposited thereon.

Bonding pads 58 are preferably distributed around the faceplate 14, as shown in FIG. 4 and in a top view illustrated in FIG. 5 (with aluminum layer 62 also shown, as described below). These bonding pads 58 are located over the black matrix grill 52 and the ITO layer 56 and provide the location for bonding the spacers 38 to the faceplate 14. The bond pads 58 are preferably made of silicon, and preferably have a surface area when viewed from above of about 35×35 μm. As shown in FIG. 5, the bonding pads 58 are preferably alternatingly staggered across the faceplate so that the spacers 38 bonded thereon are also spaced in a staggered configuration. It will be appreciated that bond pads 58 may be located in various other configurations on the faceplate 14.

As shown in FIGS. 4 and 5, glass spacers 38 are bonded to the faceplate 14 at bond pads 58 to form the spacers between the faceplate 14 and baseplate 12 (not shown). These spacers 38 are more preferably made of a soda lime silicate glass or borosilicate glass, or glass containing oxides of B, Fe, Si, Pb, N, K, Ba, Al and Ag. Bonding of the spacers to the faceplate is preferably accomplished using anodic bonding, although other types of bonding such as adhesive bonding may also be used.

Figure 6:
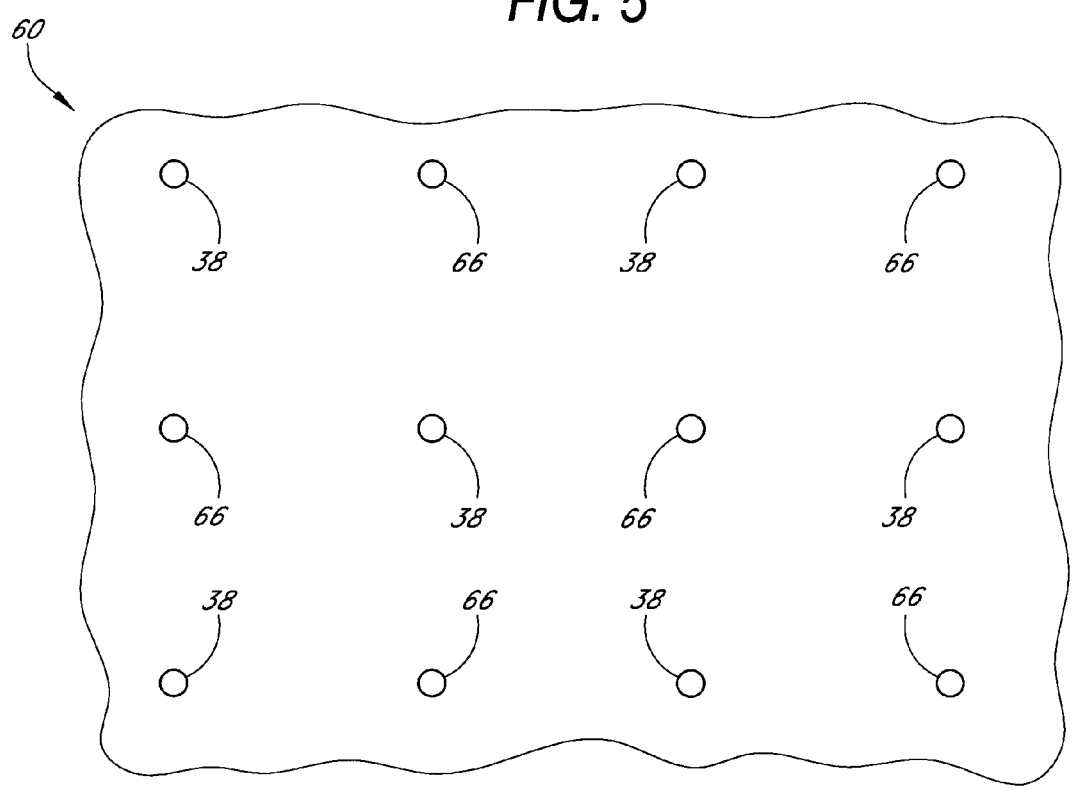
FIG. 6 is a schematic top view of an array of spacers to be bonded to the faceplate of FIG. 5.
Figure 7:
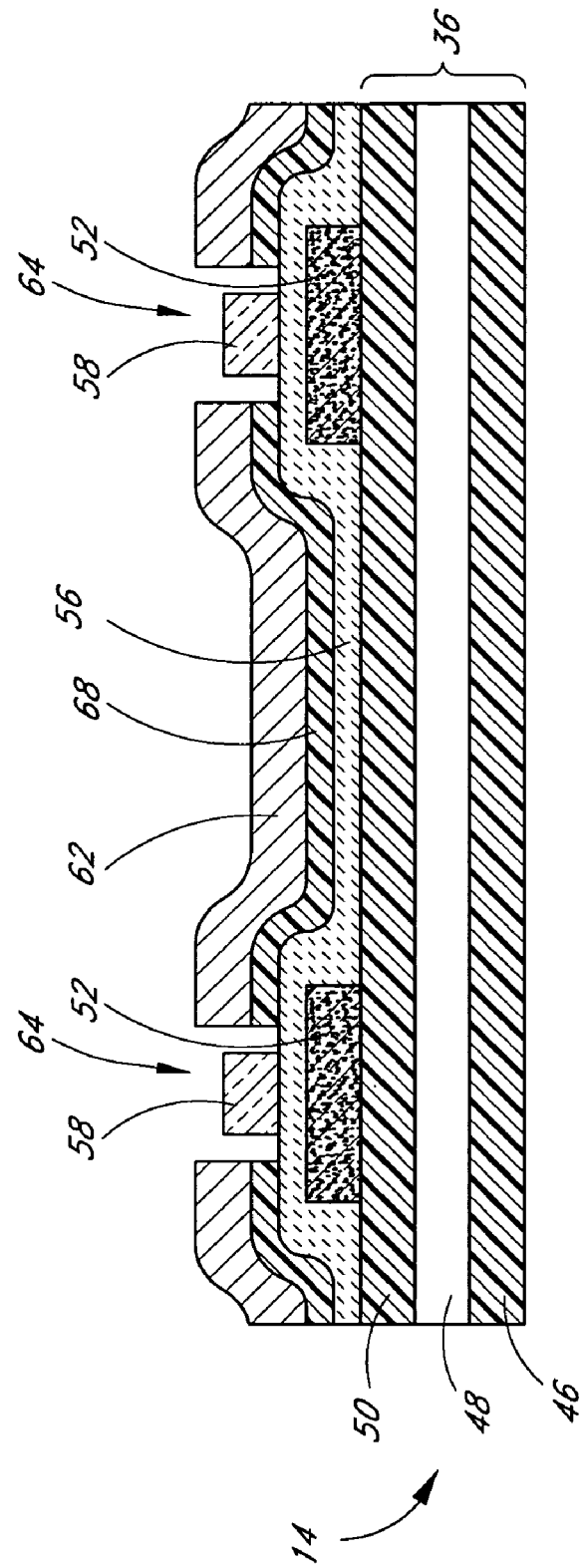
FIG. 7 is a schematic cross-sectional view of a flat panel display faceplate having an aluminum layer formed thereover for use in an anodic bonding process.

Although the bond pads are preferably alternatingly staggered around the faceplate 14 as shown in FIG. 5, it is preferred in one embodiment to attach spacers to the faceplate 14 using a uniform array 60 of spacers, such as shown in FIG. 6, which contains more spacers than there are bond pads 58. Thus, the array 60 not only contains the spacers 38 which are to be anodically bonded to the bond pads 58, but it also contains misaligned spacers 66 which will not be bonded to the bond pads 58. The misaligned spacers are instead anodically bonded to a sacrificial aluminum layer 62 formed over the faceplate 14, as illustrated in FIG. 7 and described in further detail below. A matrix glass material is used to keep the spacers in the proper pattern until after they are selectively removed after anodic bonding. In one embodiment, after bonding the matrix glass is removed by etching preferably using an $HNO_3/H_2O$ or $HCl/HNO_3/H_2O$ or $HCl/H_2O$ mixture. Then, the bulk of the aluminum is removed preferably using $HNO_3/H_3PO_4$/acetic acid mixture. KOH or NaOH is then preferably used to remove the misaligned spacers 66. The advantages of the uniform array 60 include its simplicity of design as well as lower cost. Furthermore, because anodic bonding occurs at temperatures, for example, of about 450° C., a uniform array of spacers is desired to create a more uniform stress distribution when the structure is subsequently cooled.

As shown in FIGS. 5 and 7, the aluminum layer 62 has wells 64 to permit access for the aligned spacers 38 to the bonding pads 58. Then, when the array 60 of spacers 38 is brought to the faceplate 14 for anodic bonding, spacers 38 are bonded to the bond pads 58 within the wells 64, while the misaligned spacers 66 are bonded to the aluminum layer 62, as shown in phantom in FIG. 5. During subsequent processing of the faceplate, this aluminum layer 62 is removed, along with the misaligned spacers 66 to leave the desired spacer arrangement.

FIG. 7 illustrates generally the structure of the desired aluminum layer over the faceplate 14 for use in the anodic bonding procedure described above. An optional barrier layer 68 is first formed over the ITO layer 56, such as made of $SiO_2$, $SiN_x$ or $Al_2O_3$. In one embodiment, the barrier layer is a $Si_3N_4$ layer having a thickness of about 950 Å. An aluminum layer 62 is formed over the barrier layer 68, which preferably has a thickness between about 3,000 and 10,000 Å, and in one embodiment, has a thickness of about 5500 Å. The height of the aluminum layer 62 with the barrier layer 68 preferably corresponds approximately to the height of the bond pads 58.

Wells 64 are preferably formed through the aluminum layer 62 and barrier layer 68 down to the ITO layer 56, as shown in FIG. 7. These wells 64 are staggered in the desired configuration according to where the bonding pads 58 and spacers 38 are to be located, as shown in FIG. 5. In one embodiment, the wells preferably have a bottom surface area of about 45×45 μm. After anodic bonding is complete, the barrier layer 68 and aluminum layer 62 are removed giving the faceplate 14 the structure shown in FIG. 4.

Figure 8:
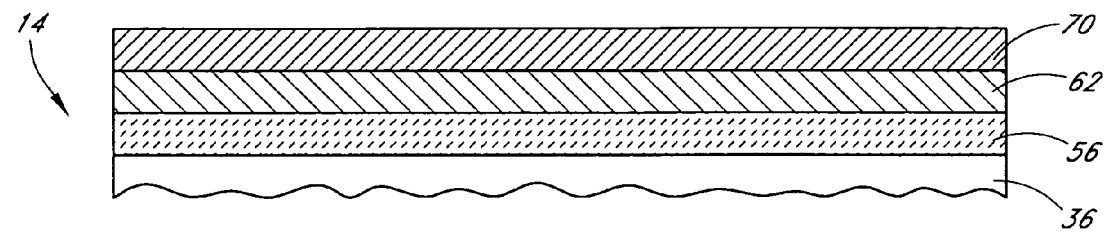
FIG. 8 is a schematic cross-sectional view of a structure having an ITO layer for a flat panel display faceplate with an aluminum layer and a protective chromium layer formed thereover.

FIGS. 8-15 illustrate more particularly the formation of the well structure illustrated in FIG. 7. FIG. 8 illustrates schematically a portion of the faceplate 14 wherein the ITO layer 56 is formed over a substrate 36. This substrate 36 may include the $SiN_x$ layers 46 and 50 and glass layer 48 described above, the black matrix layer 52, or any other substrate as would be known to one of skill in the art. The ITO layer 56 is preferably deposited over the substrate 36, and as described above, an aluminum layer 62 is formed over the ITO layer 56. An optional barrier layer 68, illustrated in FIG. 7 but not shown in FIG. 8, may also be used.

The aluminum layer 62 is preferably deposited using DC sputtering at a pressure of about 1-10 mTorr at a power of about 2,000 to 10,000 watts. Pure Ar gas is used as a carrier, flowing at a rate of about 10 to 800 sccm. The substrate temperature is preferably between about 100° and 400° C. It will be appreciated that the aluminum layer 62 can be formed by a variety of methods, including RF sputtering, DC sputtering, ion beam sputtering, these and other methods being known to one of ordinary skill in the art.

As shown in FIG. 8, a protective layer 70 is formed over the aluminum layer 62. This layer 70 is preferably made of chromium, although it will be appreciated that other materials, such as chrome alloys, nickel and cobalt may also be used. These particular materials are preferred because they are inexpensive and are easily deposited onto substrates using physical vapor deposition. Chrome materials are even more preferred because of their robustness and process repeatability, and because selective wet etching chemistry is well-known for Al/Cr films. In addition, Cr may be processed to have no pinholes and disallow diffusion of wet chemicals through itself. The protective layer 70 preferably has a thickness between about 500 and 5000 Å.

Figure 9:
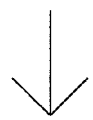
FIG. 9 is a schematic cross-sectional view of the structure of FIG. 8 having a photoresist layer formed over the protective layer.
Figure 9:
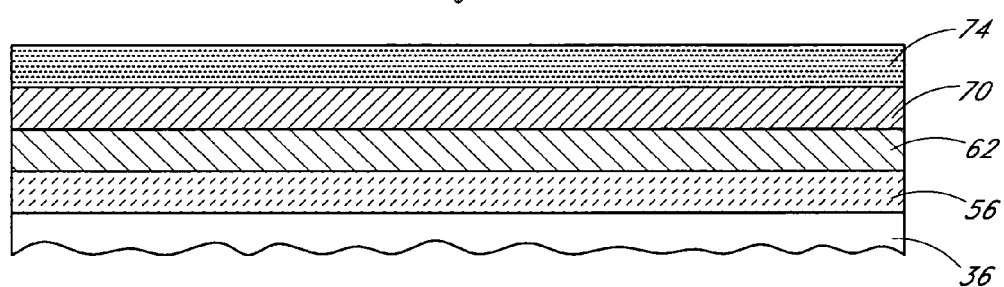
Figure 10:
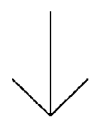
FIG. 10 is a schematic cross-sectional view of the structure of FIG. 9 showing the photoresist layer being selectively exposed to ultraviolet light.
Figure 10:
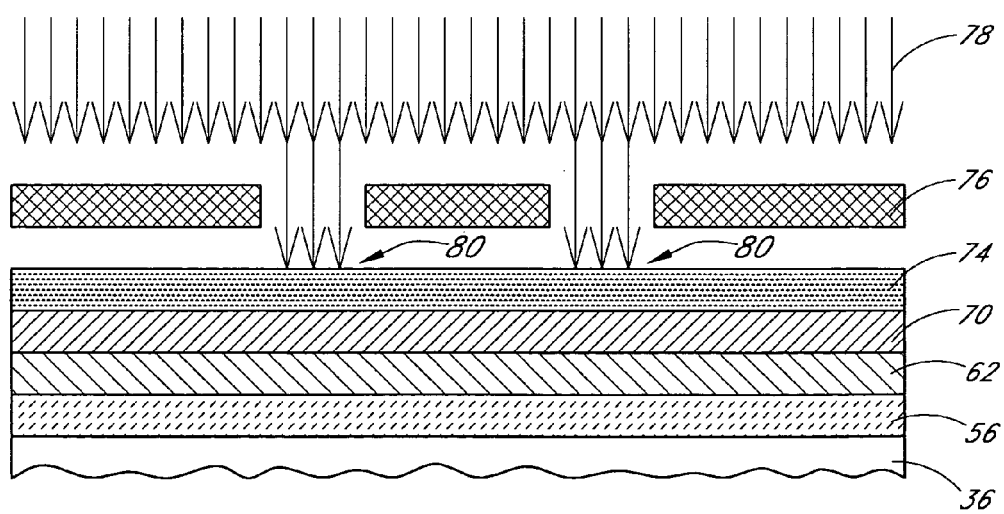

As shown in FIG. 9, a photoresist layer 74 is formed over the protective layer 70. More preferably, a positive photoresist having a thickness of about 5,000 to 30,000 Å is used to coat the protective layer 70. Using an exposure mask 76 as shown in FIG. 10, the photoresist layer 74 is then exposed to ultraviolet light 78 in selected regions 80 of the layer 74.

Figure 11:
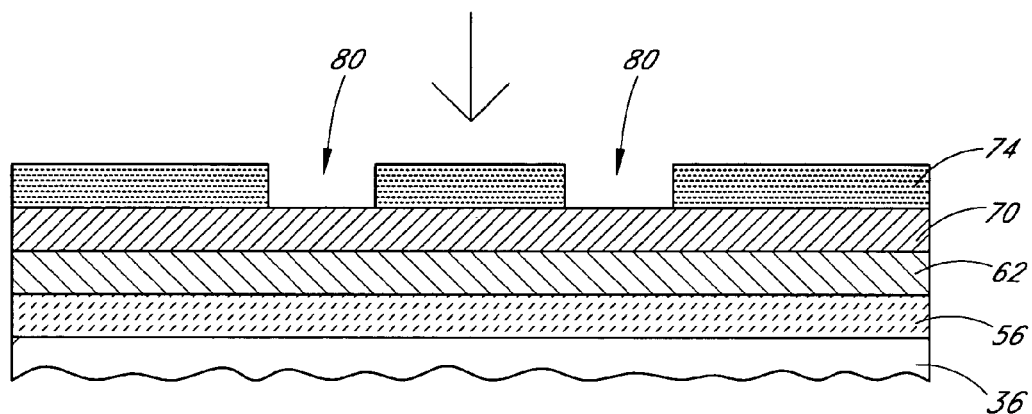
FIG. 11 is a schematic cross-sectional view of the structure of FIG. 10 showing the photoresist layer undergoing development.

FIG. 11 illustrates the development stage in which a developer of positive photoresist is preferably used to remove photoresist from the selected regions 80 at the photoresist layer 74. In one embodiment, TMAH is used as the developer of the positive photoresist layer 74. It will be appreciated that other developers, such as NaOH and KOH, may also be used. As can be seen in FIG. 11, because of the presence of the protective layer 70, the aluminum layer 62 is not exposed to the developer.

Figure 12:
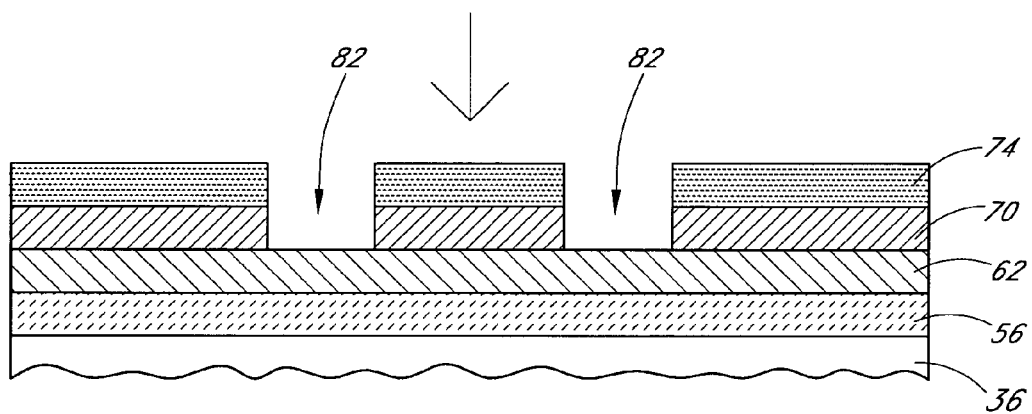
FIG. 12 is a schematic cross-sectional view of the structure of FIG. 11 showing the protective layer being selectively etched.
Figure 13:
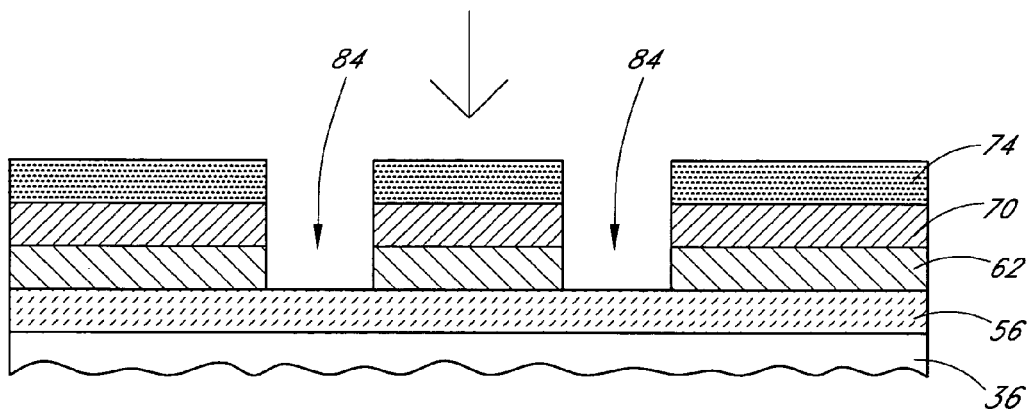
FIG. 13 is a schematic cross-sectional view of the structure of FIG. 12 showing the aluminum layer being selectively etched.

After the selected regions 80 of photoresist are removed, the protective layer 70 is etched in selected regions 82 below the regions 80, preferably using an etchant of ceric ammonium nitrate and acetic acid mixture when chromium is used for the protective layer. This etching step is shown in FIG. 12. Selected regions 84 of the aluminum layer 62 are then also removed below the regions 82, preferably using an etchant such as phosphoric acid, nitric acid, water, and acetic acid mixtures. More preferably, an etchant formulation of 80% phosphoric acid, 5% nitric acid, 5% acetic acid and 10% water may be used to etch the aluminum. The etching of the aluminum layer 62 exposes the surface of the ITO layer 56, as shown in FIG. 13.

Figure 14:
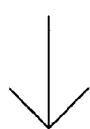
FIG. 14 is a schematic cross-sectional view of the structure of FIG. 13 showing the photoresist layer stripped.
Figure 14:
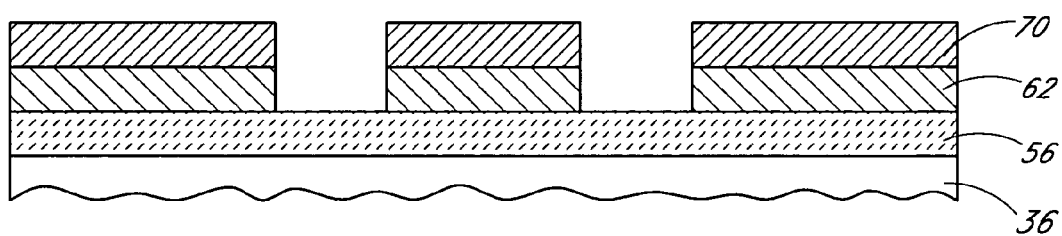

As shown in FIG. 14, the photoresist layer 74 is then stripped from the protective layer 70. Stripping of the photoresist layer 74 is preferably accomplished using NMP (n-methyl-2-pyrrolidone), or other highly basic solvents, having pH values preferably in the range of about 8 to 13. Because the protective layer 70 remains on the aluminum layer 62, the ratio of exposed ITO to exposed aluminum is high, thereby minimizing corrosion of the ITO.

Figure 15:
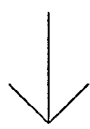
FIG. 15 is a schematic cross-sectional view of the structure of FIG. 14 showing the protective layer removed.
Figure 15:
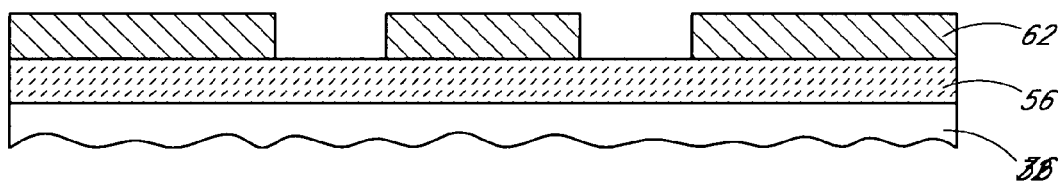

As shown in FIG. 15, after the photoresist layer 74 has been stripped, the protective layer 70 may be completely removed. For a chromium protective layer, this removal process is preferably accomplished using a ceric ammonium nitrate etchant mixed with acetic acid, which selectively removes the chromium layer without affecting the underlying aluminum. This leaves the desired pattern of aluminum over the ITO.

In embodiments where the aluminum layer is to be removed from the ITO, for example, after anodic bonding of misaligned spacers is completed, the aluminum can be removed by an etchant solution comprising phosphoric acid, nitric acid and acetic acid. Such a solution selectively etches the aluminum without attacking surrounding silicon. This etchant solution preferably removes the bulk of the aluminum, and any residual aluminum may be removed using an etchant of KOH. The KOH solution does not corrode the ITO layer because the bulk of aluminum has been removed by the phosphoric acid/nitric acid/acetic acid etchant solution, thereby minimizing the ratio of aluminum to ITO surface area exposed to the solution.

The embodiments described above illustrate the advantages of using a protective layer such as chromium, chrome alloys, nickel or cobalt over aluminum in contact with ITO. By masking off the aluminum layer from solvents and solutions used, for instance, during photolithography and etching, a barrier is created preventing diffusion through the aluminum to cause reductive corrosion of the ITO. Furthermore, the presence of the protective layer minimizes the ratio of aluminum to ITO surface area exposed to solution, which also reduces or eliminates corrosion. This leads overall to an ITO layer having a minimum number of defects with good electrical conductivity and optical transparency, and which adheres well to the aluminum layer.

The embodiments illustrated and described above are provided merely as examples of certain preferred embodiments of the present invention. Other changes and modifications can be made from the embodiments presented herein by those skilled in the art without departure from the spirit and scope of the invention, as defined by the appended claims.

What is claimed is:

1. A display device structure, comprising:
   a substrate;
   an electrically conductive and optically transparent layer over the substrate;
   an aluminum layer directly over the electrically conductive and optically transparent layer; and
   a metallic protective layer over the aluminum layer.

2. The display device structure of claim 1, wherein the electrically conductive and optically transparent layer is made of indium tin oxide.

3. The display device structure of claim 1, wherein the protective layer is made of a material selected from the group consisting of chromium, chrome alloys, nickel and cobalt.

4. The display device structure of claim 1, wherein the protective layer is made of chromium, and has substantially no pinholes.

5. The display device structure of claim 1, further comprising a barrier layer between the layer of electrically conductive and optically transparent material and the aluminum layer.

6. The display device structure of claim 1, wherein the substrate forms part of a faceplate for a flat panel display.

7. The display device structure of claim 1, wherein the layer of electrically conductive and optically transparent material has a thickness of between about 2000 and 5000 Å.

8. The display device structure of claim 1, wherein the aluminum layer has a thickness of between about 3000 and 10,000 Å.

9. The display device structure of claim 1, wherein the protective layer has a thickness of between about 500 and 5000 Å.

10. A display device structure, comprising:
    a substrate;
    an electrically conductive and optically transparent layer over the substrate;
    an aluminum layer over the electrically conductive and optically transparent layer; and
    a metallic protective layer over the aluminum layer, wherein the protective layer is made of a material selected from the group consisting of chromium, chrome alloys, nickel, and cobalt.

11. The display device structure of claim 10, wherein the protective layer is made of chromium, and has substantially no pinholes.

12. The display device structure of claim 10, wherein the electrically conductive and optically transparent layer is made of indium tin oxide.

13. The display device structure of claim 10, further comprising a barrier layer between the layer of electrically conductive and optically transparent material and the aluminum layer.

14. The display device structure of claim 10, wherein the protective layer has a thickness of between about 500 and 5000 Å.

15. A display device structure, comprising:
    a substrate;
    an electrically conductive and optically transparent layer over the substrate;
    an aluminum layer directly over the electrically conductive and optically transparent layer; and
    a protective layer over the aluminum layer.

16. The display device structure of claim 15, wherein the electrically conductive and optically transparent layer is made of indium tin oxide.

17. The display device structure of claim 15, wherein the protective layer is made of chromium, and has substantially no pinholes.

18. The display device structure of claim 15, further comprising a barrier layer between the layer of electrically conductive and optically transparent material and the aluminum layer.

19. The display device structure of claim 15, wherein the aluminum layer has a thickness of between about 3000 and 10,000 Å.

20. The display device structure of claim 15, wherein the protective layer has a thickness of between about 500 and 5000 Å.

* * * * *